(12) United States Patent
Bengtsson et al.

(10) Patent No.: US 10,473,707 B2
(45) Date of Patent: Nov. 12, 2019

(54) MONITORING A TRANSFORMER COMPRISING A TAP CHANGER

(71) Applicant: ABB Schweiz AG, Baden (CH)

(72) Inventors: Tord Bengtsson, Västerås (SE);
Nilanga Abeywickrama, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/328,482

(22) PCT Filed: Aug. 25, 2017

(86) PCT No.: PCT/EP2017/071433
§ 371 (c)(1),
(2) Date: Feb. 26, 2019

(87) PCT Pub. No.: WO2018/037114
PCT Pub. Date: Mar. 1, 2018

(65) Prior Publication Data
US 2019/0195933 A1 Jun. 27, 2019

(30) Foreign Application Priority Data

Aug. 26, 2016 (EP) .................................... 16185960

(51) Int. Cl.
*G01R 31/40* (2014.01)
*G01R 31/02* (2006.01)
(Continued)

(52) U.S. Cl.
CPC ........... *G01R 31/027* (2013.01); *H01F 29/02* (2013.01); *H01F 38/14* (2013.01); *H02H 7/055* (2013.01)

(58) Field of Classification Search
CPC .... G01R 31/40; G01R 31/025; G01R 31/343; G01R 15/18; G01R 15/181; G01R 15/183;
(Continued)

(56) References Cited

U.S. PATENT DOCUMENTS

| 4,795,983 A * | 1/1989 | Crockett ................. G01R 27/18 |
| | | 324/509 |
| 5,448,491 A * | 9/1995 | Janke ..................... G01R 27/18 |
| | | 324/500 |

(Continued)

FOREIGN PATENT DOCUMENTS

| EP | 2541572 A1 | 1/2013 |
| JP | H08213257 A | 8/1996 |

(Continued)

OTHER PUBLICATIONS

European Search Report Application No. EP 16 18 5960 Completed: Jan. 24, 2017; dated Feb. 13, 2017 8 pages.
(Continued)

*Primary Examiner* — Jermele M Hollington
*Assistant Examiner* — Taqi R Nasir
(74) *Attorney, Agent, or Firm* — Whitmyer IP Group LLC (57) ABSTRACT

The invention is concerned with a monitoring device, method and computer program product for monitoring a transformer having a tap changer. The transformer has at least two magnetically coupled windings and a tap changer having impedance elements and a changeover switch configured to gradually pass the impedance elements when changing between two tap changer positions during a tap change operation. The method is performed in the monitoring device and including: obtaining waveforms of measured power transmission properties recorded at the first and second transformer sides, processing the recorded wave-
(Continued)

forms for obtaining at least one waveform (Ploss) representing a tap change operation, and extracting information indicative of the performance of the tap change from the at least one waveform that represents the tap change operation.

15 Claims, 5 Drawing Sheets (51) Int. Cl.
H01F 29/02 (2006.01)
H02H 7/055 (2006.01)
H01F 38/14 (2006.01)

(58) Field of Classification Search
CPC .. G01R 31/42; G01R 31/027; G01R 19/2513; G01R 21/00
USPC .......... 324/547, 615, 726, 127, 771, 764.01; 702/73, 58, 24, 65, 185
See application file for complete search history.

(56) References Cited

U.S. PATENT DOCUMENTS

| | | | |
|---|---|---|---|
| 6,870,374 B2 * | 3/2005 | Perkins | G01R 31/1263 324/520 |
| 7,345,488 B2 * | 3/2008 | Fischer | G01R 29/16 324/509 |
| 8,095,326 B2 | 1/2012 | Berggren et al. | |
| 2012/0173180 A1 | 7/2012 | Kim | |
| 2013/0183043 A1 * | 7/2013 | Elberbaum | G01R 19/00 398/115 |
| 2013/0282312 A1 * | 10/2013 | Abeywickrama | G01R 31/027 702/58 |
| 2015/0268291 A1 * | 9/2015 | Lachman | G01R 31/027 324/547 |
| 2016/0049856 A1 * | 2/2016 | Zhang | H02M 7/217 363/77 |

FOREIGN PATENT DOCUMENTS

| | | | | |
|---|---|---|---|---|
| JP | 2000208340 A | | 7/2000 | |
| WO | WO-2013000608 A1 * | | 1/2013 | ............. H01F 29/04 |

OTHER PUBLICATIONS

International Search Report and Written Opinion of the International Searching Authority Application No. PCT/EP2017/071433 Completed: Nov. 16, 2017; dated Nov. 27, 2017 12 pages.

* cited by examiner

MONITORING A TRANSFORMER COMPRISING A TAP CHANGER

TECHNICAL FIELD

The present invention relates to a monitoring device, method and computer program product for monitoring a transformer comprising a tap changer.

BACKGROUND

Transformers equipped with tap changers are frequently used in different types of power transmission environments, such as at 10 kV and above. A transformer that comprises a tap changer is able to change the turns ratio between the windings to thereby change voltage levels. This ability is in many systems used for controlling the delivery of power.

Transformers are generally reliable. The probability of them failing is low, such as around 1%. However, of those 1% that fail, typically 20-40% are due to failure in the tap changer.

The reason for this is that the tap changer is the only part of the transformer that has mechanically moving elements. Therefore this part of the transformer is more likely to cause a failure than the rest of the transformer.

When monitoring a transformer it would therefore be of interest to monitor a tap change operation when the turns ratio is changed. If such monitoring is performed then it may be possible to predict when the tap changer is about to wear out. Thereby maintenance may be more easily planned, which is of advantage both with regard to reliability and economy.

Tap changer monitoring is described in a number of documents.

US 2012/0173180 does for instance disclose a method and apparatus for evaluating health of a tab changer. The health is evaluated through separating a second discharge signal from a first discharge signal using a third discharge signal and determining the health through comparing the second discharge signal and a first initial value. The third discharge signal may be a second initial value or a fourth discharge signal. The first initial value is a signal generated in the tab changer and the second initial value is a signal generated in a main tank of the transformer, while the first and fourth discharge signals are high frequency currents in a grounded line of the tab changer. The document also mentions the use of an output voltage detector detecting the output voltage of a secondary coil and used in the control of the tab changer.

EP 2541 572 discloses a protection arrangement for a tap changer where the current through the tap changer is detected and used to generate a current indication signal. The duration of the current indication signals is then compared with a threshold and a fault indication signal generated if it is.

JPH 08-213257 is concerned with obtaining a measure of the health of a tap change based on a current signal corresponding to the current through the tap changer.

JP 2000-208340 is concerned with using a waveform obtained through measuring power transmission properties on one side of a transformer.

However, a tap change is not easily detected in the waveforms that are available for monitoring purposes. This is especially the case when the transformer is used at high loads. Furthermore, it is often not enough to merely detect a tap change in a waveform. It may be necessary to also extract information indicative of the health of the tap changer from such waveforms. It can thereby be seen that it may be very hard to determine the health of a transformer using the available waveforms.

It is therefore of interest to monitor a transformer equipped with a tap changer in a way that information indicating the performance of the tap changer can be extracted using the available waveforms and used for condition monitoring purposes.

The present invention is directed towards such transformer monitoring.

SUMMARY

The present invention is thus directed towards monitoring a transformer with regard to tap changer operation.

This object is according to a first aspect of the present invention achieved through a monitoring device for monitoring a transformer comprising a tap changer, where the transformer has at least two magnetically coupled windings arranged at a first and a second transformer side and the tap changer comprises impedance elements and a switch configured to gradually pass the impedance elements when changing between two tap changer positions during a tap change operation. The monitoring device in turn comprises: a waveform analyzer operative to obtain waveforms of measured power transmission properties recorded at the first and second transformer sides, said measured power transmission properties being currents and/or voltages, process the recorded waveforms for obtaining at least one waveform representing a tap change operation, and extract information indicative of the health of the tap change from said at least one waveform that represents the tap change operation, wherein the extracted information comprises an operation duration time covering at least a part of the tap change operation and/or an amplitude of said at least one waveform representing the tap change operation.

This object is according to a second aspect achieved through a method for monitoring a transformer comprising a tap changer. The transformer has at least two magnetically coupled windings and the tap changer comprises impedance elements and a switch configured to gradually pass the impedance elements when changing between two tap changer positions during a tap change operation. The method is performed in a protection device and comprises:

obtaining waveforms of measured power transmission properties recorded at the first and second transformer sides, said measured power transmission properties being currents and/or voltages processing the recorded waveforms for obtaining at least one waveform representing a tap change operation, and extracting information indicative of the health of the tap change from said at least one waveform that represents the tap change operation, wherein the extracted information comprises an operation duration time covering at least a part of the tap change operation and/or an amplitude of said at least one waveform representing the tap change operation.

The object is according to a third aspect of the present invention achieved through a computer program product for monitoring a transformer comprising a tap changer. The transformer has at least two magnetically coupled windings and the tap changer comprises impedance elements and a switch configured to gradually pass the impedance elements when changing between two tap changer positions during a tap change operation. The computer program product comprises a data carrier with computer program code configured to cause a waveform analyzer of a monitoring device to obtain waveforms of measured power transmission properties recorded at the first and second transformer sides, said measured power transmission properties being currents and/or voltages process the recorded waveforms for obtaining at least one waveform representing a tap change operation, and extract information indicative of the health of the tap change from said at least one waveform that represents the tap change operation, wherein the extracted information comprises an operation duration time covering at least a part of the tap change operation and/or an amplitude of said at least one waveform representing the tap change operation.

The present invention has a number of advantages. It provides an improved monitoring of a transformer equipped with a tap changer, where it is possible to evaluate the performance of the tap changer. Thereby a more reliable maintenance planning can be made. This is also done without the need for monitoring dedicated tap changer properties but only using measurement quantities that are traditionally available for a transformer. Thereby the improved monitoring is also obtained using a minimum of additional hardware and avoiding introduction of additional sensors and retrofitting of waveform recorders.

BRIEF DESCRIPTION OF THE DRAWINGS

The present invention will in the following be described with reference being made to the accompanying drawings, where FIG. 1 schematically shows a transformer equipped with a tap changer, FIG. 2 schematically shows the tap changer and one winding of the transformer in FIG. 1, FIG. 3 schematically shows power loss in the transformer occurring during a tap change operation, FIG. 4 schematically shows a waveform recorder together with a waveform analyzer for monitoring the transformer.

DETAILED DESCRIPTION

In the following, a detailed description of preferred embodiments of the invention will be given.

Figure 1:
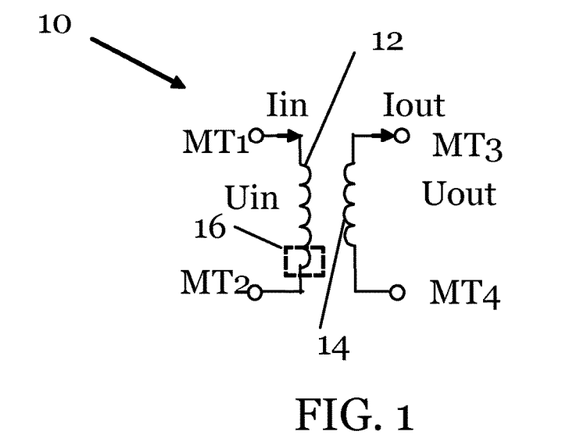

FIG. 1 shows a transformer 10 having a first winding 12 and a second winding 14 magnetically coupled to each other. These windings thus form a pair, often denoted primary and secondary windings. The first winding 12 is furthermore connected to a tap changer 16. In the figure there are also shown a number of power transmission properties of the transformer that may be measured during operation. There is an input current Iin fed into and input voltage Uin applied over the first winding 12. There is also an output current Iout delivered from and an output voltage Uout provided by the second winding 14. The input current Iin and the input voltage Uin are measurement quantities that are measured at a first and a second measurement terminal MT1 and MT2 of the first winding 12, where the first measurement terminal MT1 is provided at a first end of the first winding 12 and the second measurement terminal MT2 at a second end of the first winding 12. The output current Iout and the output voltage Uout are measurement quantities measured at a third and a fourth measurement terminal MT3 and MT4 of the second winding 14, where the third measurement terminal MT3 is provided at a first end and the fourth measurement terminal MT4 is provided at a second end of the second winding 14. It can thus be seen that electric power enters and exits the transformer at the measurement terminals. The above described example assumes a power transfer through the transformer from the first to the second winding. Thereby the first winding 12 forms an input side and the second winding an output side of the transformer 10. However, it should be realized that power may be transferred in the opposite direction, in which case the input current and input voltage would be measured at the third and fourth measurement terminals MT3 and MT4, while the output current and output voltage would be measured at the first and second measurement terminals MT1, and MT2. Then the second winding 14 would form the input side and the first winding 12 would form the output side. The measurement quantities are therefore also power transmission properties that are measured at the measurement terminals.

The transformer shown is schematically represented. It should be realized that it may also comprise an iron core. It should also be realized that a transformer in many cases is a three-phase transformer. This means that there would be three pairs of windings. A transformer may also comprise more than one secondary winding magnetically coupled to the same primary winding. The tap changer may as an alternative also be connected to the second winding.

Figure 2:
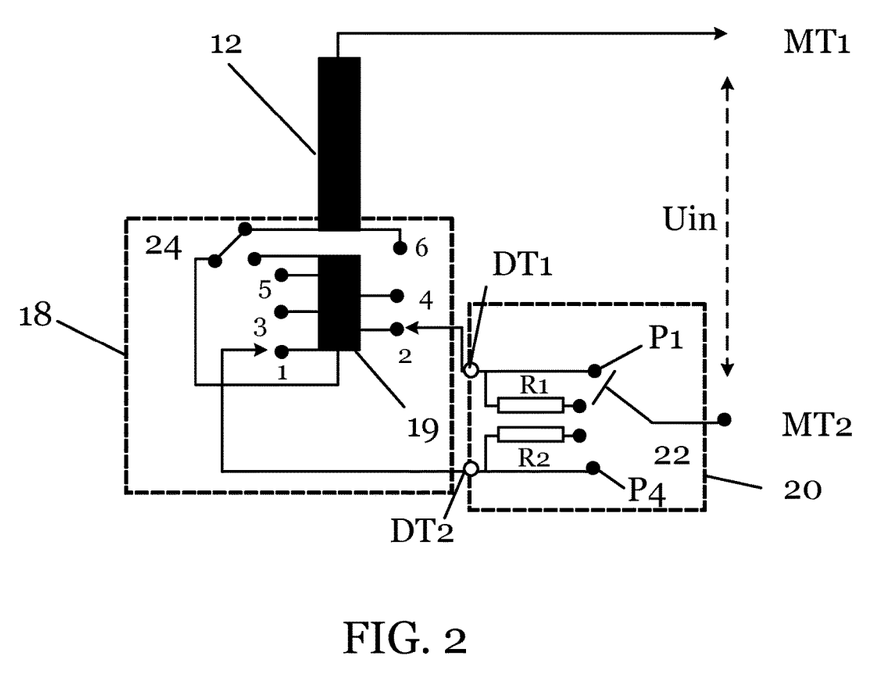

FIG. 2 schematically shows the first winding 12 together with a tap changer that comprises a regulating winding 19. The first winding has a first and a second end, with the first end connected to the first measurement terminal MT1 and the second end connectable to the regulating winding 19. The regulating winding 19 also has a first and a second end. The tap changer furthermore comprises a diverter 20 and a selector 18 that selects a number of turns of the regulating winding 19 that are to be connected to the primary winding 12.

The selector 18 has a selector switch 24 that is used to reverse the orientation of the regulating winding 19 and therefore has a first end connected to the second end of the first winding 12 and a second end moveable between two positions, a first position at the first end of the regulating winding 19 and a second position at the second end of the regulating winding 19. Each winding 12 and 19 comprises a number of turns of electrical conductor. Furthermore, the regulating winding 19 comprises a number of tap points of which six 1 2, 3, 4, 5 and 6 are shown as an example. The tap points are used for determining how many turns of the regulating winding 19 that are to be connected to the first winding 12 by a first selector arm connected to a first diverter terminal DT1 and a second selector arm connected to a second diverter terminal DT2.

The diverter 20 in turn comprises a diverter switch 22 with a first end connected to the second measurement terminal MT2 and a second end that is connectable between four contact positions, where a first contact position P1 leads to the first diverter terminal DT1 via a first diverter arm, a second contact position leads to the first diverter terminal DT1 via an impedance element in the form of a first resistor R1, a third contact position leads to the second diverter terminal DT2 via an impedance element in the form of a second resistor R2 and a fourth contact position P4 leads directly to the second diverter terminal DT2 via a second diverter arm. The diverter 20 is provided for commutating a load between the two selector arms.

It should here be realized that this is merely one realization of a selector and diverter tap changer. There exist several other types of selector and diverter tap changers. There also exist other types of tap changers. Another type is for instance a selector-switch tap changer, which combines the selection and commutation in one movement but have a similar contacting sequence as the selector and diverter tap changer. Yet another example is a vacuum tap changer, where the contact sequence often is modified but still includes a time when power is lost in impedance elements. The shown tap changer also comprises resistors as impedance element. However, it is also known to use other types of impedance elements, such as inductors. Furthermore in the shown tap changer there are two impedance elements. It should be realized that it is also possible with fewer, such as one, or even more, such as three or four.

What is common for all these tap changers is that during a tap change there is gradual movement of a switch between two positions, which in the case of the tap changer in FIG. 2 is the diverter switch 22 moving between the first and fourth positions P1 and P4. When a tap change is desired one of the selector arms is originally connected between a tap position and the corresponding diverter terminal. As an example the first selector arm may be connected between the second tap position 2 shown in FIG. 2 and the first diverter terminal DT1 and at the same time the diverter switch 22 is in the first contact position P1. Thereby the first selector arm is loaded, i.e. a load current thus passes through the first diverter arm and into the first selector arm. A tap position that obtains a desired turns ratio change is then selected for the non-loaded selector arm, which in this example is the second selector arm. The second diverter terminal DT2 therefore connects the unloaded second selector arm to the selected tap position, which in the example of FIG. 2 is the first tap position 1. In order to commutate the load, i.e. to carry out the change of the turns ratio, the diverter switch 22 is then gradually moved from the first to the fourth contact position. In this gradual movement the diverter switch 22 first establishes contact with the first resistor R1 at the same time as there is contact with the first contact position P1. Then the diverter switch 22 breaks the contact with the first contact position P1 and the first diverter arm. The load current will now only run through the first resistor R1 to the first selector arm. Thereafter the diverter switch connects to the second resistor R2. At this point in time the load current will run through both the resistors R1 and R2 to both the first and second selector arms. There will also be a circulating current that is generated through the voltage difference between the diverter terminals DT1 and DT2. This is followed by the diverter switch 22 breaking the connection with the first resistor R1 and thereby load current is only running through the second resistor R2 to the second selector arm. Finally the diverter switch will reach the fourth contact position P4 and then the load current will run through the second diverter arm to the second selector arm. Thereby the tap change operation is completed. It can be seen that during such a movement energy is loaded or deposited into at least one impedance element and in the example of FIG. 2 in two resistors R1 and R2, which energy is consumed in the case of a resistor but only temporarily stored in the case of an inductor.

Through the above-mentioned operation of the tap changer in FIG. 2, i.e. during the gradual change between the positions P1 and P4, the impedances R1 and R2 will be connected between the measurement terminals MT3 and MT4 and therefore energy will be deposited in them. In the present example real power is lost, since the impedances are resistors. If the impedances were inductive then reactive power would instead be stored.

The instantaneous power loss may for instance be determined according to equation (1) below $$P_{loss}(t) = P^{in}(t) - P^{out}(t) = \Sigma_{phases}(U^{in}(t)I^{in}(t) - U^{out}(t)I^{out}(t)) \quad (1)$$

The equation, which is provided for a three-phase system, thereby defines the power loss of a three-phase transformer. The instantaneous power loss Ploss is thus calculated based on the power transmission property measurements obtained at the first, second, third and fourth measurement terminals MT1, MT2, MT3 and MT4 as the input voltage Uin times the input current Iin minus the output voltage Uout times the output current Iout, where three such differences are obtained, one for each phase.

It is possible to obtain the real power loss from equation (1) as an average of the instantaneous power loss in a period and the reactive power loss as an oscillation with an average of zero.

Figure 3:
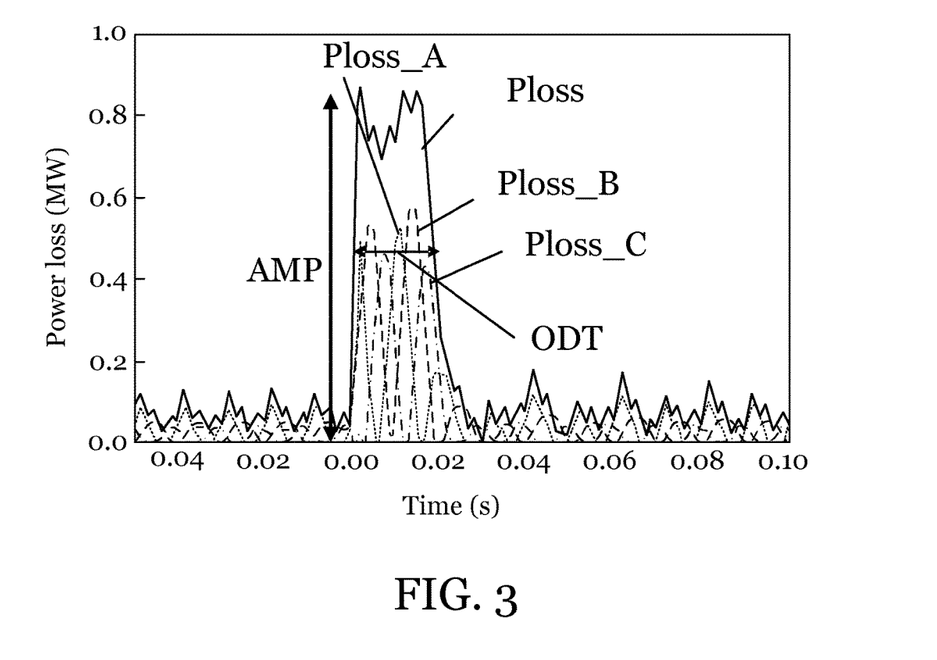

The way power loss appears at a low load of such a three-phase transformer equipped with tap changer can be seen in FIG. 3. In the figure there is shown the power loss for each phase through a concerted tap change operation in all three phases. There is a power Ploss_A in a first phase, a power loss Ploss_B in a second phase and a power loss Ploss_C in a third phase. These three power losses are furthermore summed up to a total power loss Ploss, and the total power loss Ploss has the shape of a "pulse". In the figure it can be seen that the tap changing operation is carried out between times 0.00 and 0.02 s. It can be seen that the "pulse" or this interval as an example has a width of 20 ms and the width is a peak duration time of an energy deposition or a peak duration energy deposition time and in this interval, each phase experiences power loss. This peak duration time is an operation duration time ODT between a rising edge and a falling edge of the "pulse". This time is termed an operation duration time because the time duration corresponds to the duration of at least some steps in the operation of the tap changer. It thus covers at least a part of the tap change operation. It can more particularly be seen that the operation duration time ODT more or less corresponds to the time that the diverter switch 22 is solely connected to the resistors R1 and R2. It can also be seen that the power loss during the tap changer operation has an amplitude AMP. The amplitude and operation duration time ODT are examples of information that is indicative of tap changer performance or tap changer health, is obtainable via recorded waveforms and can be used for monitoring purposes.

Transformers are generally reliable. The probability of them failing is low, such as around 1%. However, of that 1% that fail, typically 20-40% are due to failure in the tap changer.

As mentioned above the only moving elements of a transformer are included in the tap changer. It can thereby be seen that the tap changer is relevant to the reliability.

If the transformer is monitored with regard to the operation of the tap changer, for instance through analyzing the changes of the operation duration time and amplitude in tap change "pulses" over time, it is possible to determine the health of the tap changer and thereby also the health of the transformer. This can be used to better plan maintenance of the transformer. A too short commutation time may be risky due to the fact that possible arcs are most reliably quenched at current zero crossings. This means that the operation duration time should be longer than half a period. If the arc is able to survive the operation there will be a short circuiting of the regulating windings, which will in turn develop a lot of energy and cause the transformer to break down. A too short operation duration time may thus correspond to a failed tap changer. On the other hand, too long commutation times indicate that there is friction in the system but no indication of breakdown. A long operation duration time is thus an indication that service is needed. Through monitoring the changes in the operation duration time it is thereby possible to predict when a failure would occur as well as to plan service of the transformer. The amplitude AMP in turn indicates the size of the resistance. If the amplitude changes then the resistance changes. Furthermore a high amplitude corresponds to a small resistance and a low amplitude to a high resistance. The amplitude may be of importance if no "pulse" can be seen at all, which would mean that either the tap changer has not moved or that the resistance is close to infinity, i.e. that the resistor is broken. Both these situations are important fault cases, where the latter may give rise to arcs that short-circuit the regulating winding.

However, there is a problem in that it is not possible to directly monitor the tap changer. Transformers do not normally have any measurement quantities that are directly related to the tap changing operation. The monitoring of the health of the transformer with regard to the tap changer would therefore have to be made using general transformer measurement quantities, such as input/output currents and voltages.

Moreover, these general measurement quantities are not always that easy to use. As can be seen in FIG. 3 it is possible to obtain information that can be used for tap changer monitoring purposes, for instance based on power loss. However, as mentioned earlier FIG. 3 shows the power loss at low loads. If the transformer experiences a high load, then it is not that easy to extract the information indicative of tap changer performance from the available measured waveforms as FIG. 3 would seem to suggest. The information indicative of tap changer performance may then be "drowned" in the steady-state data because of the reactive loss in the winding due the inductance, which loss is proportional to the load current.

It can therefore be seen that there is a need to process available general transformer waveforms in order to obtain information indicative of the performance of a tap change operation, which information may be studied in order to, for instance, plan maintenance.

The invention addresses this problem.

One way of addressing this problem is through the use of a monitoring device.

Figure 4:
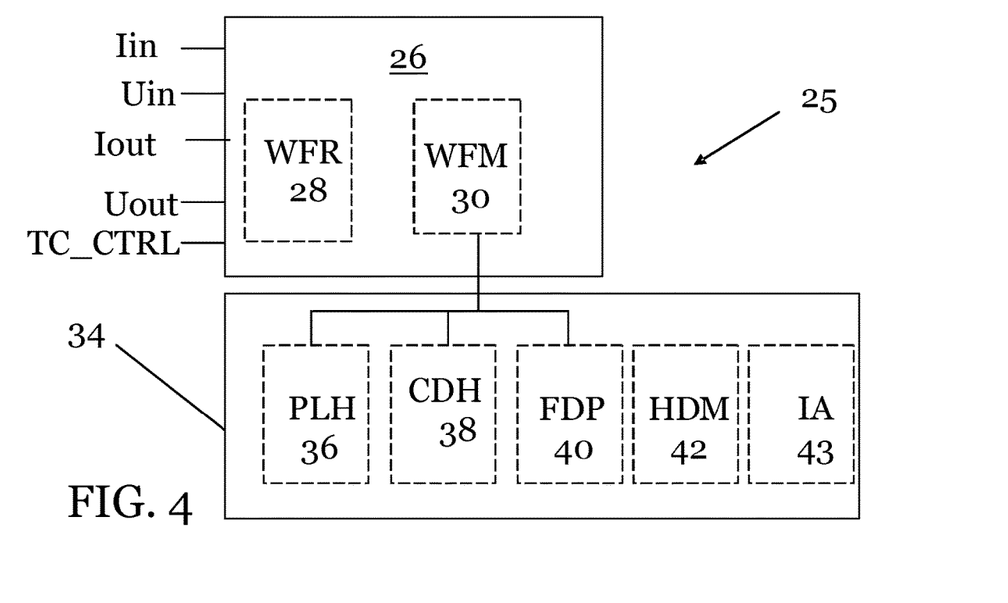

One way of realizing a monitoring device 25 is shown in. FIG. 4. The monitoring device 25 comprises a waveform recorder 26, which comprises a waveform recording block WFR 28 that receives measurement quantities of the transformer in the form of the measured power transmission properties Iin, Uin, Iout and Oout as well as a tap changer control signal TC_CTRL, which is a control signal sent to the tap changer in order to effectuate or start a tap change operation. Such a control signal is typically sent from a tap changer control unit, which as an example may be associated with power control of a power transmission system. The waveform recorder 26 also comprises a waveform memory WFM 30 in which recorded waveforms are stored. When the tap changer control signal TC_CTRL is obtained by the waveform recorder 26, the waveform recording block 28 records a number of waveforms of the input and output currents and input and output voltages (if available) and stores these in the waveform memory 30. The obtaining or reception of the tap changer control signal TC_CTRL thus triggers the recording of waveforms, which recording then continues for a pre-determined time, such as for 10 seconds. This has the advantage of providing waveforms that clearly coincide with a tap changer operation. Furthermore, the length is such that it safely allows waveform prediction to be made. Also the control signal typically precedes the actual tap change operation such that a reliable prediction of a steady state operational waveform may be made.

The monitoring device 25 also comprises a waveform analyzer 34, which comprises a power loss handling block PLH 36, a current difference handling block CDH 38 and a frequency domain processing block FDP 40. Each of these blocks provide a separate way of obtaining at least one waveform from which it is possible to extract information indicative of a tap change. Finally the waveform analyzer 34 comprises an information analyzing block IA 43 and a health data memory HDM 42 in which (time stamped) waveforms and/or (time stamped) tap changer performance indication information are stored for condition monitoring purposes.

The waveform analyser 34 may be implemented through a computer or a processor with associated program memory comprising computer instructions implementing the above described blocks. It may also be realized through one or more dedicated components such as Application Specific Integrated Circuits (ASICSs) or Field Programmable Gate Arrays (FPGAs) realizing the blocks. It should also be realized that the waveform analyzer sometimes only needs to comprise one of the power loss handling block 36, current difference handling block 38 and frequency domain processing block 40. It should also be realized that it is possible that the information analyzing block 43 is omitted and its functionality provided in another entity such as a separate monitoring computer.

The realization of a waveform recorder 26 is as such known, but may in some respects also be realized in the same way as the waveform analyser 34. It may however also comprise Analog/Digital (A/D) converters and possibly also scaling units for scaling at least some of the received signals.

Figure 5:
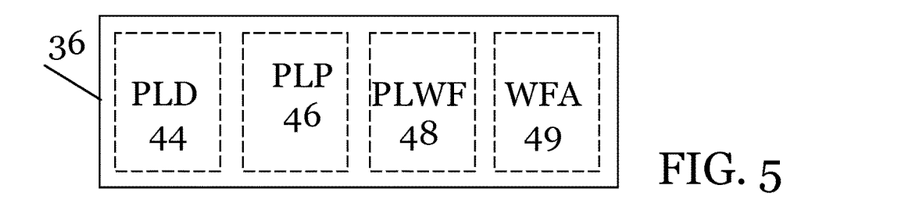
FIG. 5 shows a block schematic of a power loss handling block in the waveform analyzer.
Figure 6:
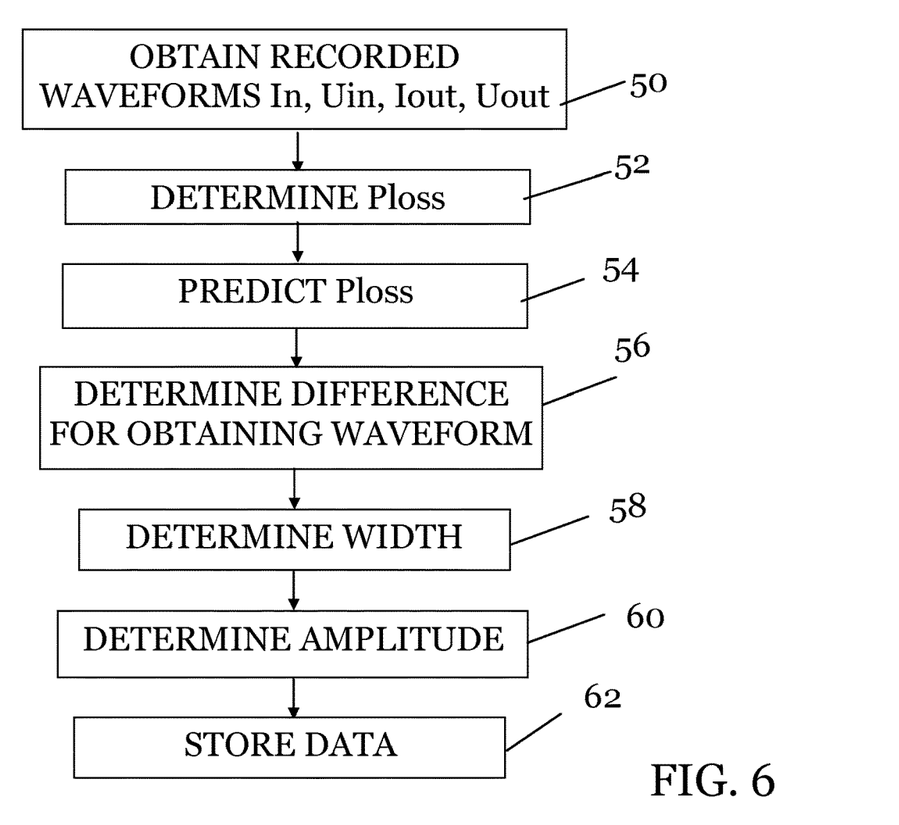
FIG. 6 shows a flow chart of method steps in a first embodiment of a method of monitoring the transformer being performed by the power loss handling block in the waveform analyzer.

One way of operating the waveform analyzer 26 in order to monitor the transformer 10 will now be described with reference also being made to FIG. 5, which shows a block schematic of the power loss handling block 36 and to FIG. 6, which shows a flow chart of a number of method steps in a method of monitoring the transformer 10 performed in the power loss handling block 36.

The power loss handling block 36 comprises a power loss determining element PLD 44, a power loss predicting element PLP 46, a power loss waveforming element PLWF 48 and a waveform analyzing element WFA 49.

As was mentioned above, the waveform recorder 26 records the waveforms that appear at the measurement terminals when there is a tap change operation triggered by the tap changer control signal TC_CTRL, which waveforms are stored in the waveform memory 30.

The recorded waveforms also have a start point and an end point.

In order to obtain a waveform that is indicative of the performance of a tap change, the power loss determining 44 element of the power loss handling block 36 first obtains the recorded waveforms In, Uin, Ipout and Uout from the waveform memory 30 of the waveform recorder 26, step 50, which are thus the waveforms of power transmission properties recorded at the first and second transformer sides.

Thereafter the power loss handling block processes the recorded waveforms for obtaining at least one waveform representing a tap change operation.

The processing of this first embodiment involves the processing of a difference between a power transmission property on both sides of the transformer using the measured power transmission properties. In this first embodiment the power transmission property in question is the derived property of power and the difference between the two sides is the power loss through the transformer expressed as a power loss waveform. The processing of this first embodiment furthermore involves predicting at least one waveform of the same type as the difference waveform and obtaining each waveform representing the tap change operation as a difference between the difference waveform and the corresponding predicted waveform, where there is one predicted waveform and one difference waveform in this first embodiment.

Therefore the determining element 44 determines the power loss of the transformer using the input and output current In, Uin, Iout and Oout waveforms, step 52. The power loss may in this case be determined in the way shown in equation (1) above.

At the same time, the power loss predicting element 46 predicts the same power loss, step 54.

This prediction may comprise a prediction of the stationary waveforms of current and voltage on the first and second sides of the transformer 10. Each such signal Uin, In, Uout, Iout may be predicted from earlier observations through generating a spectrum from an oscillating signal and extracting the important frequency amplitudes. From these amplitudes the waveform at future times can be predicted. The prediction method is described in more detail in U.S. Pat. No. 8,095,326, which is herein incorporated by reference.

The predicted waveforms may therefore correspond to stationary waveforms of the currents and voltages at the first and second sides of the transformer, i.e. waveforms without any embedded tap change information. These predicted waveforms may then be used in the forming of a predicted power loss, step 54.

Thereafter the powerloss waveforming element 48 determines the difference between the determined and predicted power loss for obtaining a waveform defining the tap change operation, step 56. The difference is then used as a waveform that defines the tap change operation. As mentioned above the prediction of power loss would represent the steady state power loss without the tap change operation. Therefore, in such a difference waveform essentially only the previously shown "pulse" of FIG. 3 should be present and thereby the information indicative of tap change performance can be easily extracted from the waveform.

The difference may as an example be obtained as $$\Delta P_{loss}(t) = P_{loss}(t) - P_{loss}^{pred}(t) \qquad (2)$$

One way in which this may be done is through $$\Delta P_{loss}(t) = \Sigma_{phases} V_i(t) \Delta I_i(t) + \Delta V_i(t) I_i(t) + \Delta V_i(t) \Delta I_i(t) \qquad (3)$$

Equation (3) shows a determination of an input or output power change, where i thus encodes input or output side and ΔI and ΔV are the differences between predicted and actual current and voltage waveforms.

The power loss difference between actual and predicted power loss will then be:

$$\Delta P_{loss}(t) = \Delta P_{in}(t) - \Delta P_{out}(t) \qquad (4)$$

Thereby the steady state components have been removed and the result is a waveform that represents the tap change operation and that in essence only comprises the power loss due to the tap change operation. In this waveform it is then easy to determine the width or operation duration time ODT, for instance through identifying the time between the rising edge and the falling edge in the waveform, step 58, as well as the amplitude AMP, step 60, which determinations may be performed by the waveform analyzing element 49. The information indicative of the performance of the tap change operation, i.e. the amplitude AMP and operation duration time ODT, may then be stored, possibly time stamped, together with the power loss difference waveform, in the health data memory 42 for use in condition monitoring of the transformer, step 62. In this regard also other information may be stored, such as initial and final tap positions, load currents etc.

Health determination and predictions may then be performed by the information analyzing block 43. The information analyzing block 43 may thus analyze the information ODT and AMP indicative of tap change operation that is stored in the memory 42 by the waveform analyzing element 49, estimate the wear of the transformer and determine when maintenance is to be made or rather determine at which service window the transformer is to be replaced or serviced. As an alternative it is possible that the power loss analyzing element 49 is omitted and the power loss waveforming element 48 stores the power loss difference waveform in the health data memory 42. In this case the information analyzing block 43 may instead obtain the power loss difference waveform from the health data memory 42 and extract the information ODT and AMP indicative of tap change operation therefrom when determining the health of the transformer.

It can in this way be seen that it is possible to identify a tap change operation as well as to extract tap change performance indication information using the available waveforms irrespective of the size of the load. Thereby the planning of maintenance may be improved.

In short, it can be seen that an improved monitoring of a transformer equipped with a tap changer is obtained, where it is possible to evaluate the performance of the tap changer. Thereby a more reliable maintenance planning can be made. This is also done without the need for dedicated tap changer monitoring sensors but only using measurement quantities that are traditionally available for a transformer. In this way the improved monitoring is obtained using a minimum of additional hardware and also without introduction of additional sensors and retrofitting of waveform recorders.

It is known that in some substations all voltages are not accessible as some voltages may be measured at a distant substation on the same line. In such a case there are no voltage waveforms available and therefore the power loss is impossible to use for obtaining waveforms from which tap change indication information can be extracted.

A second embodiment where prediction is also used addresses this situation.

Figure 7:
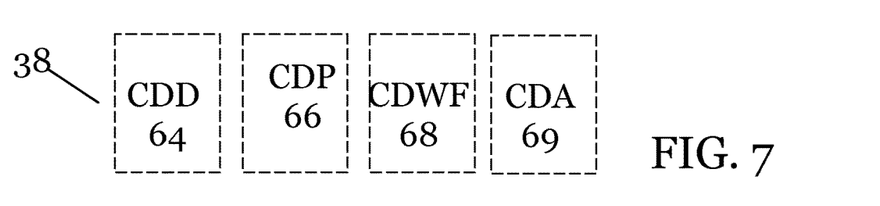
FIG. 7 shows a block schematic of a current difference handling block in the waveform analyzer.
Figure 8:
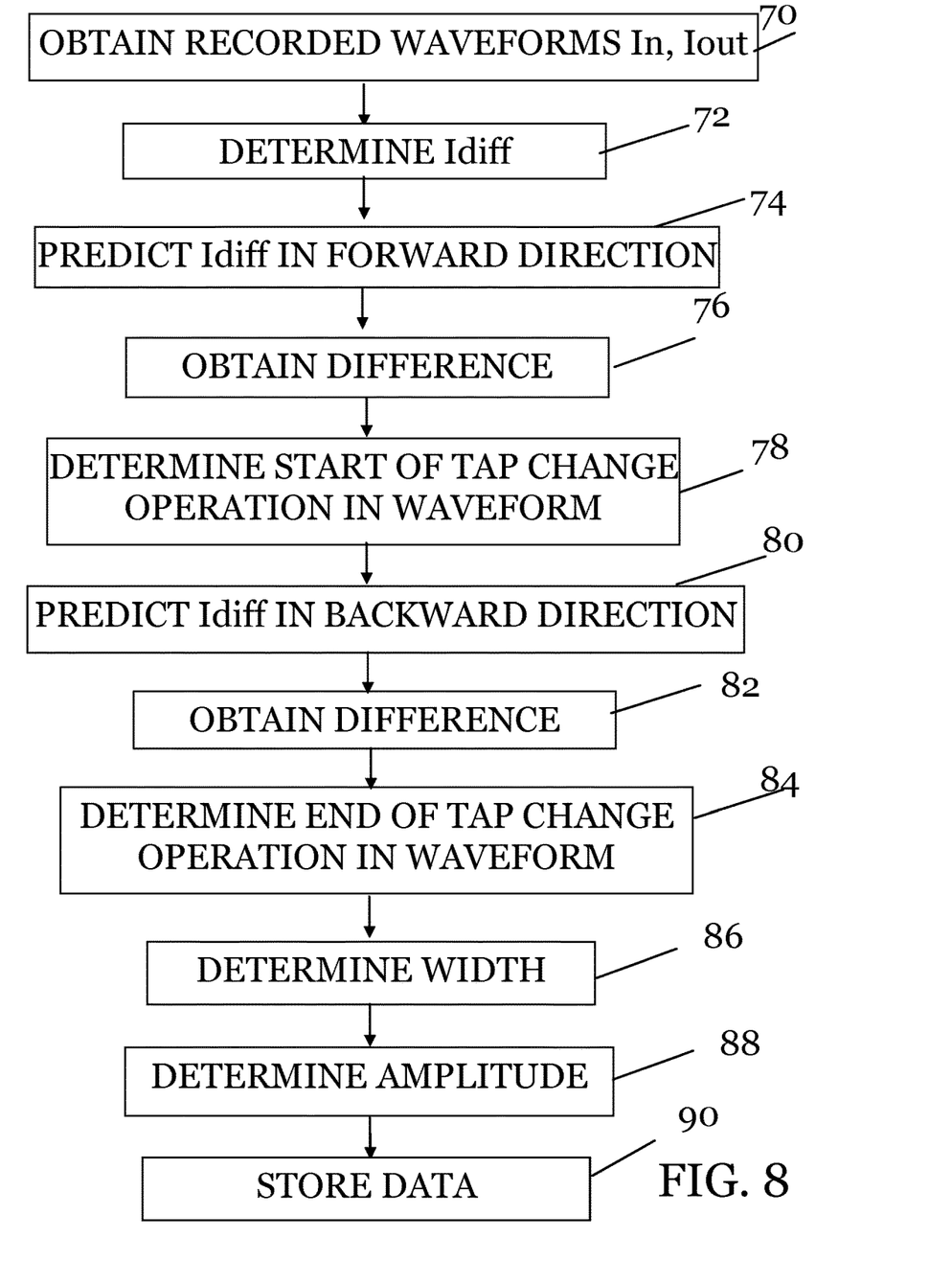
FIG. 8 shows a flow chart of method steps in a second embodiment of the method of monitoring the transformer being performed by the current difference handling block in the waveform analyzer.

This second embodiment will now be described with reference also being made to FIGS. 7 and 8, where FIG. 7 shows a block schematic of the current difference handling block 38 and FIG. 8 shows a flow chart of a number of method steps in the method of monitoring the transformer and being performed by the current difference handling block 38.

The current difference handling block 38 comprises a current difference determining element CDD 64, a current difference predicting element CDP 66, a current deviation waveform determining element CDWF 68 and a current difference analyzing element 69.

Also in this embodiment there is processing of a difference between a power transmission property on both sides of the transformer using the measured power transmission properties. In this second embodiment the power transmission property in question is the measured power transmission property of current and the difference between the two sides is the current difference between the two sides. Also in this case, the processing involves predicting waveforms of the same type as the difference waveform, i.e. predicting current difference waveforms. The processing also comprises obtaining each waveform representing the tap change operation as a difference between the difference waveform and the corresponding predicted waveform. In this second embodiment two waveforms are predicted, one forward in time and one backwards in time from the difference waveform and the obtaining of at least one waveform comprises obtaining two deviation waveforms; one as a difference between the difference waveform and a first of the predicted waveforms and another as a difference between the difference waveform and a second of the predicted waveforms.

In order to obtain the at least one waveform that is indicative of the performance of the tap changer, the current difference determining element 66 of the current difference handling block 38 first obtains the recorded waveforms In and Iout of all phases from the waveform memory 30 of the waveform recorder 26, step 70, where the waveforms of the measured power transmission properties in this embodiment only comprises current waveforms recorded at the first and second transformer sides.

Thereafter the current difference determining element 64 determines a current difference Idiff between the currents on the two sides of the transformer, step 72.

The current difference may be based on the determining of partial current differences for the different phases.

For a phase p, the corresponding partial current difference may be obtained as $$I_p^{diff}(t) = I_p^{in}(t) - \frac{I_p^{out}(t)}{n_p^e} \quad (5)$$

where $n_p^e$ is an effective ratio of the specific phase that is obtained using a Discrete Fourier Transformation (DFT) calculation of the current amplitudes and depends on the turns ratio and a current sensor calibration error.

The total current difference for all phases may thereafter be determined as:

$$I_{sum}^{diff}(t) = \sqrt{(I_1^{diff}(t))^2 + (I_2^{diff}(t))^2 + (I_3^{diff}(t))^2} \quad (6)$$

It is possible to make predictions of the current differences using the same above-described prediction technique described above.

Therefore, in this embodiment the current difference predicting element 66 predicts a first difference current. The prediction may be made based on the same equations (5) and (6) above that have been modified in line with equations (2) and (3). Furthermore the prediction is in this case made in the forward direction starting from the beginning of the waveform and towards the end of the recording, step 74.

The current deviation waveform determining element 68 then obtains or determines a first current deviation waveform as the difference between the actual and first predicted current difference waveforms, step 76. In this waveform it is then possible for the current difference analyzing element 69 to detect the start of the tap change operation, step 78, for instance through detecting a rising edge or high positive time derivative of the waveform. It is also possible for it to detect an amplitude.

However, the end of the tap change operation is not as easy to detect using the first current deviation waveform because the stationary waveforms have been changed. Therefore, in order to detect the end of tap change operation the current difference predicting element 66 predicts a second current difference in the backward direction, i.e. starting at the end of the waveform recording and going backwards in time, step 80.

This is followed by the current deviation waveform determining element 68 obtaining or determining a second current deviation waveform as the difference between the actual and second predicted current difference waveforms, step 82. In this waveform it is then possible for the current difference analyzing element 69 to detect the end of the tap change operation, step 84, for instance through detecting a falling edge or large negative time derivative of the waveform. Also here it is possible to detect an amplitude.

Through combining the two current deviation waveforms it is then possible for the current difference analyzing element 69 to determine the "pulse" width or operation time duration, step 86, and through looking at any of the current deviation waveforms also the amplitude may be determined or obtained, step 88. The information indicative of tap change performance may then be stored, possibly time stamped, in the health data memory 42, step 90. Also here other information may be stored, such as initial and final tap positions, load currents etc. It is also possible that the current deviation waveform determining element 66 stores the first and second current deviation waveforms in the memory 42.

The information analyzing block 43 may thereafter analyze the stored information and/or waveforms for condition monitoring purposes. Also here it is possible that the information analyzing block 43 extracts the tap change performance indication information from the current deviation waveforms if this has not already been done.

The second embodiment is thus an alternative to the first embodiment when there are no measured voltages available from the waveform recorder 26.

Both the above described embodiments rely on concerted tap change operation in the three phases. However, for some tap changer installations, most notably when there are three separate tap changers, one for each phase, the tap change operation of the different phases may not be concerted. The tap change operation may thus be performed independently of each other in the different phases. Therefore it may be necessary to monitor the transformer with regard to a tap change operation separately for the three phases.

The above described power loss and current difference approaches are hard to use for this scenario.

Figure 9:
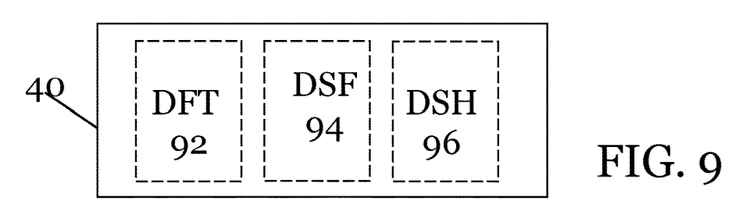
FIG. 9 shows a block schematic of a frequency domain processing block in the waveform analyzer.
Figure 10:
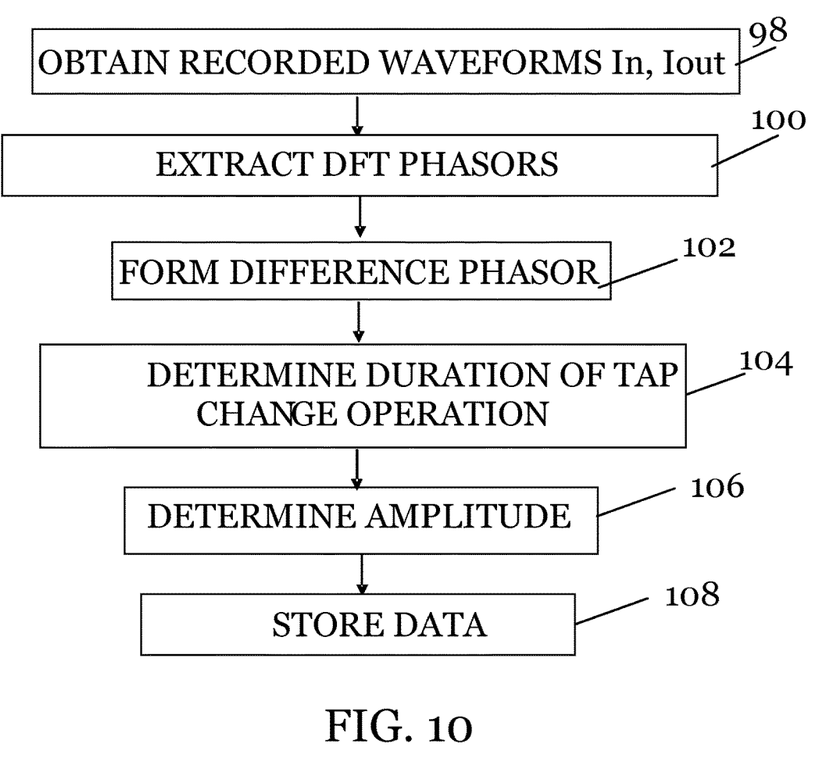
FIG. 10 shows a flow chart of method steps in a third embodiment of the method of monitoring the transformer being performed by the frequency domain processing block in the waveform analyzer, and FIG. 11 schematically shows a computer program product in the form of a data carrier comprising computer program code for implementing the waveform analyzing unit.

A third embodiment that is directed towards extracting information indicative of tap change performance individually for the different phases will now be described with reference being made to FIGS. 9 and 10, where FIG. 9 shows a block schematic of the frequency domain processing block 40 and FIG. 10 shows a flow chart of a number of method steps in the method of monitoring the transformer being performed by the frequency domain processing block 40.

The frequency domain processing block 40 comprises a DFT processing element DFT 92, a difference signal forming element DSF 94 and a difference signal handling element DSH 96.

The DFT processing element 92 of the frequency domain processing block obtains the recorded waveforms In an Iout of all phases from the waveform memory 30 of the waveform recorder 26, step 98.

Also in this embodiment there is processing of a difference between a power transmission property on both sides of the transformer based on the measured power transmission properties. Also in this third embodiment the power transmission property is the current and the difference between the two sides is the current difference between the two sides. However, unlike in the previous embodiments there is in this case a determining of a time dependent Discrete Fourier Transformation (DFT) phasor on the first and second transformer side and the forming of a time dependent difference phasor as a difference between these two DFT phasors. Therefore the information is extracted from the time dependent difference phasor.

The operation of the third embodiment is more particularly the following:

It then extracts DFT phasors using the DFT transforming unit, step 100.

A DFT phasor may be obtained as a complex time varying DFT amplitude in a frequency analysis that is made for the operational frequency of the current, which may be 50 Hz.

A DFT phasor may as an example be obtained as:

$$I^{DFT}(t_k) = \frac{1}{N} \sum_{i=-\frac{N}{2}+1}^{\frac{N}{2}} e^{2\pi * j i/N} I(t_{i+k}) \quad (7)$$

where $N=t_s/T$ with $t_s$ being the sampling time interval, T the fundamental period, $t_k$ the sampling time instances and $I(t_{i+k})$ the current at a time instance $t_{i+k}$ for a calculation around $t_k$.

The above mentioned calculation may then be repeated over the entire waveform and increasing k with at least one between each calculation.

Thereafter the difference signal forming element 94 forms one difference signal or current difference phasor per phase and this is done through obtaining a difference between the two current phasors of a phase, step 102.

The difference may more particularly be obtained as $$\Delta I^{DFT} = I_{in}^{DFT} - \frac{I_{out}^{DFT}}{n} \quad (8)$$

where $I^{DFT}$ is again a DFT phasor and n a ratio.

A current difference phasor may be complemented through using a value of n that is the average of the complex DFT ratio estimates before and after tap change operation.

The current difference phasors may provide a waveform for a phase having a width and amplitude that can be detected.

The phasor difference signal is then provided to the difference signal handling element 96, which determines the operation time duration, step 104, and amplitude, step 106, for each phase and stores them, possibly time stamped, in the health data memory 42 for use in condition monitoring of the transformer, step 108. It is also possible that the difference signal forming element 94 stores the difference signals in this memory 42. Also in this case other information may be stored, such as initial and final tap positions, load currents etc.

The difference signals are thus signals from which information indicative of tap changer performance may be extracted, such as operation time duration and amplitude. Thereby an amplitude and an operation time duration may be obtained for each phase. This is thus done for each phase and therefore it is possible to determine health also for a tap changer where tap change operation in respect of the different phases is more or less independent from each other.

Thereby it is possible to obtain individual measures of the health of the tap changer per phase which may also be used in condition monitoring. This may be used together with any of the previously mentioned monitoring methods used in the first or second embodiments.

There are a number of variations that may be made apart from those already described. It is for instance possible that the monitoring device only comprises the waveform analyzer that is set to communicate with the waveform recorder. It is also possible that the monitoring device is provided as a part of an Intelligent Electronic Device (IED) provided for the transformer.

Figure 11:
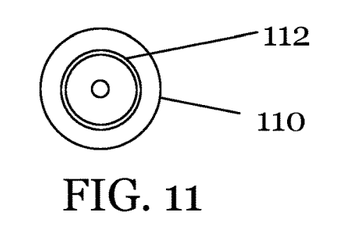

The waveform analyzer may be realized in the form of discrete components. However, it may also be implemented in the form of a processor with accompanying program memory comprising computer program code that performs the desired control functionality when being run on the processor. A computer program product carrying this code can be provided as a data carrier such as one or more CD ROM discs or one or more memory sticks carrying the computer program code, which performs the above-described waveform analyzer functionality when being loaded into a waveform analyzer. One such data carrier in the form of a CD Rom disk 110 carrying computer program code 102 is shown in FIG. 11.

From the foregoing discussion it is evident that the present invention can be varied in a multitude of ways. It shall consequently be realized that the present invention is only to be limited by the following claims.

The invention claimed is:

1. A monitoring device for monitoring a transformer comprising a tap changer, said transformer having at least two magnetically coupled windings arranged at a first and a second transformer side and the tap changer having impedance elements (R1, R2) and a switch configured to gradually pass the impedance elements when changing between two tap changer positions (P1, P4) during a tap change operation, the monitoring device comprising:
   a waveform analyzer operative to
      obtain waveforms of measured power transmission properties (Iin, Uin, Iout, Uout) recorded at the first and second transformer sides, said measured power transmission properties being currents and/or voltages, process the recorded waveforms for obtaining at least one waveform representing a tap change operation, and extract information (ODT, AMP) indicative of the health of the tap change from said at least one waveform that represents the tap change operation, wherein the extracted information includes an operation duration time (ODT) covering at least a part of the tap change operation and/or an amplitude (AMP) of said at least one waveform representing the tap change operation.

2. The monitoring device according to claim 1, wherein the waveform analyzers when processing the recorded waveforms is further operative to determine a difference waveform that sets out a difference between a power transmission property on the two sides of the transformer based on the measured power transmission properties.

3. The monitoring device according to claim 2, wherein the difference waveform is a difference waveform of a power transmission property on the two sides of the transformer and the waveform analyzer when processing the recorded waveforms is further operative to predict at least one waveform of the same type as the difference waveform and to obtain each waveform representing the tap change operation as a difference between the difference waveform and the corresponding predicted waveform.

4. The monitoring device according to claim 3, wherein the measured power transmission properties includes currents and voltages, the power transmission property of the difference waveform is power, the power difference waveform is a power loss waveform and there is one predicted waveform and differences waveform.

5. The monitoring device according to claim 3, wherein the measured power transmission properties includes currents, the power transmission property of the difference waveform is current and the waveform analyzer unit, when predicting at least one waveform is operative to predict two waveforms, one forward in time and one backwards in time, from the difference waveform and when obtaining said at least one waveform is operative to obtain two deviation waveforms one as a difference between the difference waveform and a first of the predicted waveforms and another as a difference between the difference waveform and a second of the predicted waveforms.

6. The monitoring device according to claim 2, wherein the measured power transmission properties includes currents, the power transmission property of the difference waveform is current and the waveform analyzer when processing the waveforms of the measured power transmission proprieties is further operative to determine time dependent discrete Fourier transformation (DFT) phasors on the first and second transformer side and where the difference waveform is a time dependent difference phasor between these DFT phasors and to extract said information from the time dependent difference phasor.

7. The monitoring device according to claim 6, wherein the transformer is a three-phase transformer and the waveform analyzer is configured to perform the processing separately in respect of each phase in order to obtain a waveform for the tap changing operation of each phase from which information is extracted.

8. A method for monitoring a transformers comprising a tap changer, said transformer having at least two magnetically coupled windings and the tap changer having impedance elements (R1, R2) and a switch configured to gradually pass the impedance elements when changing between two tap changer positions (P1, P4) during a tap change operation, the method being performed in a protection device and comprising:

obtaining waveforms of measured power transmission properties (Iin, Uin, Iout, Uout) recorded at the first and second transformer sides, said measured power transmission properties being currents and/or voltages, processing the recorded waveforms for obtaining at least one waveform representing a tap change operation, and extracting information (ODT, AMP) indicative of the health of the tap change from said at least one waveform that represents the tap change operation, wherein the extracted information includes an operation duration time (ODT) covering at least a part of the tap change operation and/or an amplitude (AMP) of said at least one waveform representing the tap change operation.

9. The method according to claim 8, wherein the processing of recorded waveforms further includes determining a difference waveform that sets out a difference between a power transmission property on the two sides of the transformer based on the measured power transmission properties.

10. The method according to claim 9, wherein the difference waveform is a difference waveform of a power transmission property on the two sides of the transformer and the processing the recorded waveforms further including predicting at least one waveform of the same type as the difference waveform and obtaining each waveform representing the tap change operation as a difference between the difference waveform and the corresponding predicted waveform.

11. The method according to claim 10, wherein the measured power transmission properties include currents (Iin, Iout) and voltages (Uin, Uout), the power transmission property of the difference waveform is power, the power difference waveform is a power loss waveform (Ploss) and there is one predicted waveform and difference waveform.

12. The method according to claim 10, wherein the measured power transmission properties includes currents (Iin, Iout), the power transmission property of the difference waveform is current and the predicting of at least one waveform includes predicting two waveforms, one forward in time and one backwards in time, from the difference waveform and the obtaining of said at least one waveform having obtaining two deviation waveforms one as a difference between the difference waveform and a first of the predicted waveforms and another as a difference between the difference waveform and a second of the predicted waveforms.

13. The method according to claim 9, wherein the measured power transmission properties includes currents (Iin, Iout), the power transmission property of the difference waveform is current and the processing of the waveforms of the measured power transmission proprieties further includes determining time dependent discrete Fourier transformation (DFT) phasors on the first and second transformer side, where the difference waveform is a time dependent difference phasor between these DFT phasors, and the extracting of said information includes extracting the information from the time dependent difference phasor.

14. The method according to claim 13, wherein the transformer is a three-phase transformer and the processing is performed separately in respect of each phase in order to obtain a waveform for the tap changing operation of each phase from which information is extracted.

15. A computer program product for monitoring a transformer comprising a tap changer, said transformer having at least two magnetically coupled windings and the tap changer having impedance elements (R1, R2) and a switch configured to gradually pass the impedance elements when changing between two tap changer positions (P1, P4) during a tap change operation, the computer program product including a data carrier with computer program code configured to cause a waveform analyzer of a monitoring device to     obtain waveforms of measured power transmission properties (Iin, Uin, Iout, Uout) recorded at the first and second transformer sides, said measured power transmission properties being currents and/or voltages,     process the recorded waveforms for obtaining at least one waveform representing a tap change operation, and     extract information (ODT, AMP) indicative of the health of the tap change from said at least one waveform that represents the tap change operation,     wherein the extracted information includes an operation duration time (ODT) covering at least a part of the tap change operation and/or an amplitude (AMP) of said at least one waveform representing the tap change operation.

\* \* \* \* \*